United States Patent [19]

Davis et al.

[11] Patent Number: 4,535,467
[45] Date of Patent: Aug. 13, 1985

[54] SWITCH LOGIC FOR SHIFT REGISTER LATCH PAIR

[75] Inventors: James W. Davis; Joel C. Leininger, both of Boca Raton; Carlos Munoz-Bustamante, Highland Beach, all of Fla.; Gordon J. Robbins, Wappingers Falls, N.Y.

[73] Assignee: International Business Machines Corporation, Armonk, N.Y.

[21] Appl. No.: 445,601

[22] Filed: Nov. 30, 1982

[51] Int. Cl.³ ............................................. G11C 19/00
[52] U.S. Cl. .................................. 377/81; 307/272 R
[58] Field of Search ..................... 377/81, 116, 64, 54, 377/55, 56; 307/272 R, 247 R

[56] References Cited

U.S. PATENT DOCUMENTS

| | | | |
|---|---|---|---|
| 3,294,919 | 12/1966 | Kerr et al. | 377/81 |
| 3,443,238 | 5/1969 | Flynn et al. | 330/311 |
| 3,618,033 | 11/1971 | Nordquist et al. | 377/81 |
| 3,953,746 | 4/1976 | Fett | 307/247 R |
| 4,168,540 | 9/1979 | Delker et al. | 365/227 |

Primary Examiner—John S. Heyman
Assistant Examiner—K. Ohralik
Attorney, Agent, or Firm—D. Kendall Cooper

[57] ABSTRACT

A Level Sensitive Scan Design (LSSD) Shift Register Latch pair implemented in current switch logic is disclosed. The arrangement is characterized by the logic used to control the L1 and L2 latches being implemented in Differential Cascode Current Switch logic and the L1/L2 latches being coupled to only one current source. A "merged" L1/L2 latch arrangement employing only one current source is provided for an LSSD testing environment.

14 Claims, 2 Drawing Figures

SWITCH LOGIC FOR SHIFT REGISTER LATCH PAIR

BACKGROUND OF THE INVENTION

1. Field of Invention

This invention relates in general to current switch logic and, in particular, to current switch logic in which a pair of bistable devices are cascoded to provide a shift register latch pair for level sensitive scan design testing.

2Description of the Prior Art

Very Large Scale Integration (VLSI) technology has increased the number of transistor devices that may be placed on semiconductor chips. As the number of devices increases and, hence, the number of possible circuits increases, two areas of concern have developed. The amount of power that is consumed by the chip becomes a problem in that power consumed is converted to heat which must be dissipated and controlled if the chip is to operate satisfactorily. It is known in the art that power can be reduced by employing a multi-level Cascode Current Switch (CCS) technology such as disclosed in U.S. Pat. No. 3,446,989. In CCS logic, a basic logic tree involves a number of levels each comprising basic cells. In one known arrangement, referred to as Cascode Emitter Coupled Logic (CECL), a basic cell comprises a pair of bipolar type transistors which have their emitters coupled together to either a current source for the tree or to an output of the cell in the preceding level. The cell includes two output terminals and three control input terminals comprising the bases of the respective transistors in the cell and the common emitter terminal. If the control input terminals are supplied with the true and complement form of the logic input signal, the system is referred to as a Differential CCS (DCCS) or double-rail type system. In some implementations, one control input is supplied with a reference signal, while the other input terminal receives the true form of the logic signal. The two output terminals are connected to different cells in the next higher level of the tree.

The number of levels selected for the tree can vary from two up to six, seven or eight, depending on the complexity of the logic desired to be accomplished. The output of the tree is connected to a voltage source through load resistors, while the first level of the tree has its input connected to a current source. Only one current path may be established between the current source and the load resistor since, at each level, the current from the preceding level is supplied or steered to only one cell at that level and, in turn, the cell output steers current to only one cell at the next level. Logically, "N" cascoded cells may represent an "N" input AND-gate or a complex logic function in that selected current switches at each level are connected in series. The logical arrangement is similar in many respects to relay logic employed in early data processing machines.

The other concern which arises as the number of circuits increases on a chip is the problem of testing the devices per se or the circuits formed from devices after the chip has had the devices connected together to give the desired function. A system is presently employed in the art which operates to test each circuit in the chip. A description of this testing technique, referred to as Level Sensitive Scan Design testing (LSSD), may be found in U.S. Pat. No. 3,783,254, 3,806,891 and IBM Technical Disclosure Bulletin, Vol. 22, No. 8B, January 1980, page 3660. The essence of such a system is to provide a linked pair of latches L1 and L2 which form a Shift Register Latch (SRL) stage. In order to implement an LSSD testing approach for cascode current logic, it has been the practice to provide a current source associated with the L1 latch and a second current source for the L2 latch of the Shift Register Latch stage. A typical prior art implementation for LSSD testing is shown in FIG. 1 of the drawing. The present invention is an improvement over the arrangement shown in FIG. 1 in that the second current source is eliminated and the L2 latch is effectively merged with the L1 latch and, hence, employs the same current source.

SUMMARY OF THE INVENTION

A circuit configuration that effectively merges an L1 and an L2 latch into a self-contained Shift Register Latch (SRL) unit is disclosed. By so doing, the current and power overhead incurred for support of LSSD testing techniques for LSI/VLSI type chip designs requiring SRL's is substantially reduced. The essence of the invention is the cascoding of the L2 latch above the L1 latch to make use of only a single power unit or current source and take advantage of the natural conductivity of the latches. The L1 portion of the SRL is in a conventional form. The merged Shift Register Latch system is operated by the traditional LDDS clocking scheme. Data is shifted from the L1 latch into the L2 latch by activating the "B clock". The current originating at the current source flowing in the L1 latch is detected by and steered into the L2 latch by directing it through the appropriate "B clock" switch. Deactivating the "B clock" reestablishes the current flow from the load resistor through the L2 latch and L1 latch to the single current source which serves to latch the data in both L1 and L2. It is, therefore, an object of the present invention to provide an improved circuit arrangement for LSSD type testing techniques employing current switches.

The foregoing and other objects, features and advantages of the invention will be apparent from the following more particular description of a preferred embodiment of the invention as illustrated in the accompanying drawing.

DESCRIPTION OF THE PREFERRED EMBODIMENT

Figure 1:
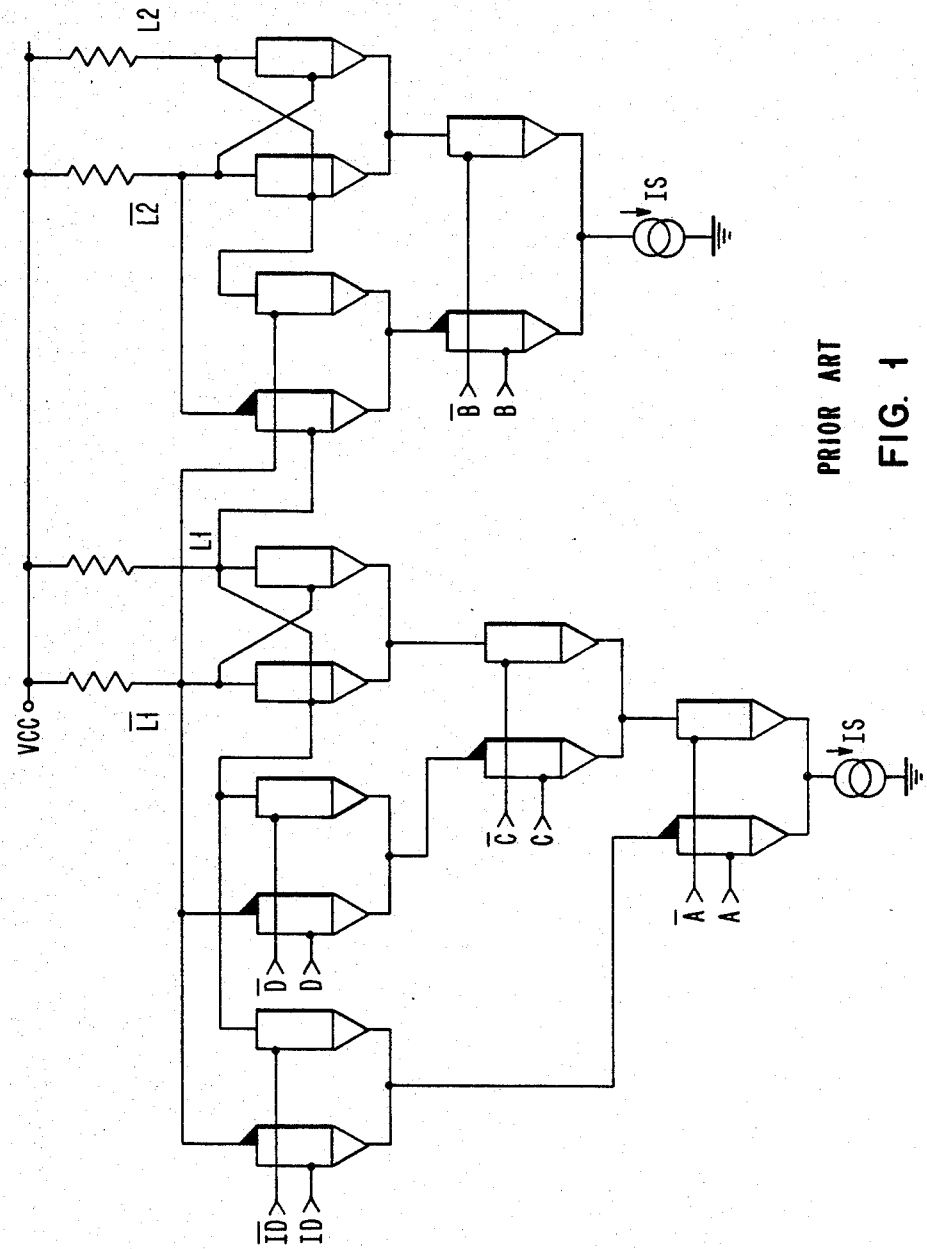
FIG. 1 is a prior art circuit arrangement in which the L2 latch of the Shift Register Latch pair is connected to a different current source than the L1 latch.
Figure 2:
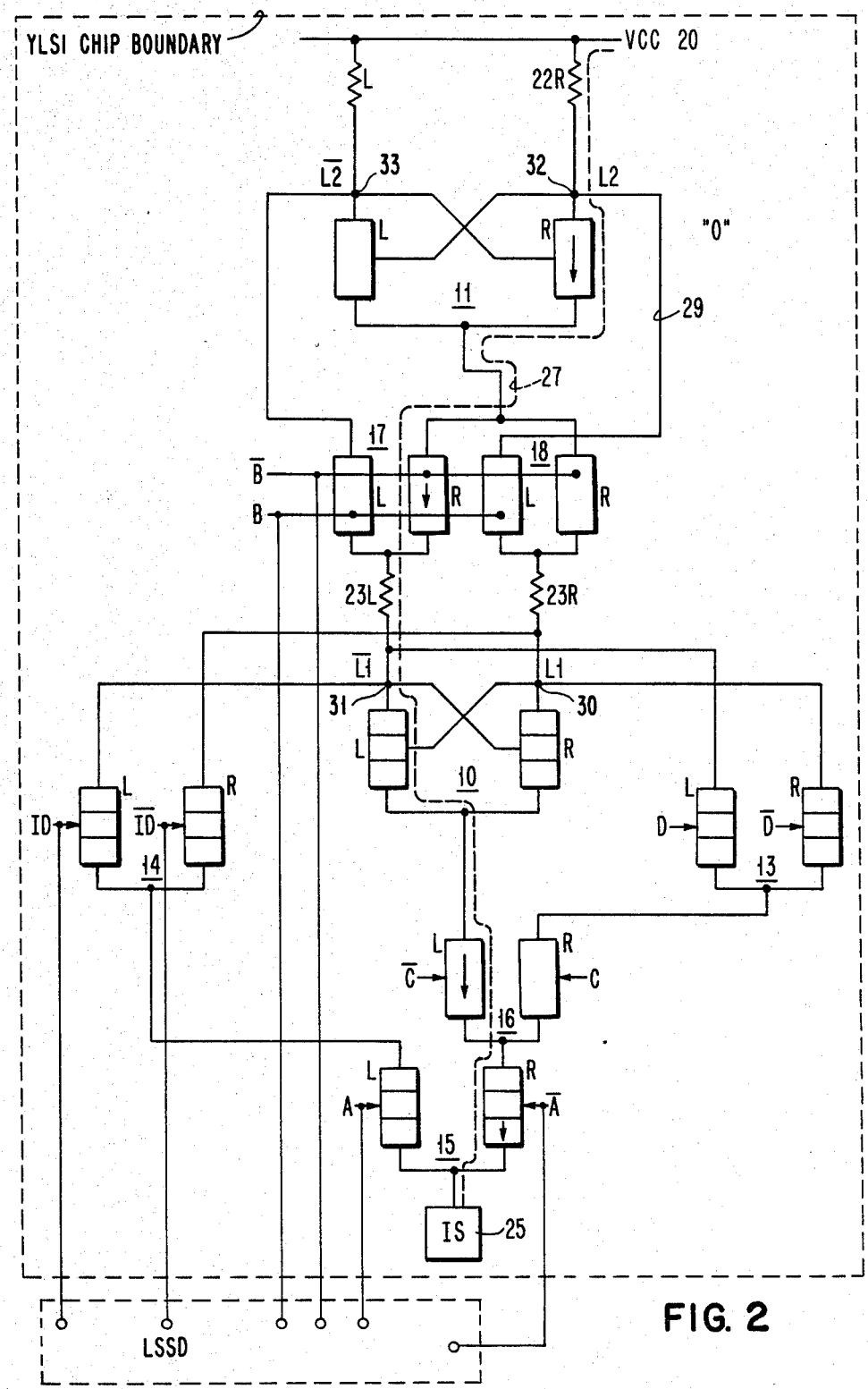
FIG. 2 is a circuit arrangement embodying the present invention in which both the L1 and L2 latches of the Shift Register Latch pair share the same current source.

FIG. 2 illustrates a Shift Register Latch pair for LSSD testing comprising L1 latch 10 having output nodes 30 and 31 and L2 and latch 11 having output nodes 32 and 33. The L1 latch 10 is adapted to store either an input system data signal D supplied differentially to current switch pair 13 or a scan data input signal ID supplied differentially to current switch pair 14. The entry of signals ID or D into latch 10 is under the control of mutually exclusive clock signals "A" and "C" supplied differentially to current switch pairs 15 and 16, respectively. Clock signal "A" corresponds to LSSD test clock "A" while clock signal "C" corresponds to the system clock, only one of which may be active at any time. Data stored in latch L1 is shifted into latch L2 under control of the LSSD "B clock" supplied differentially to current switch pairs 17 and 18.

If it is assumed that L2 is set to "0" state and L1 to a "1" state and clocks "A", "B" and "C" are off, a current path extends from voltage source VCC 20 through load resistor 22R, device 11R, device 17R, ballast resistor 23L, device 10L, device 16L and device 15R to current source 25. The current path is represented by dashed line 27.

Entry of system data in latch L1 is achieved by "C clock" going positive which switches the previous current path from device 16L to device 16R which connects to device pair 13. Assuming that the data bit to be entered is a "0", the $\overline{D}$ input is high and device 13R is turned on which sets a current path to voltage source VCC 20 through ballast resistor 23R, device 18R, device 11R and load resistor 22R. The voltage at terminal L1 of latch 10 drops relative to its previous state shutting off device 10L which raises the voltage at $\overline{L1}$ which turns on device 10R. The cross coupled devices 10R and 10L forming latch 10 are, therefore, flipped and system data is stored in latch 10. The fall of the clock transfers the current path from device 13R to 16L to maintain device 10 in the "0" state.

Transfer of the "0" data bit to the L2 latch 11 occurs when clock "B" is turned on. The current path switches from device 18R to 18L, causing terminal L2 of latch 11 to maintain a low state even though device 11R is cut off. The current flow is still through load resistor 22R via line 29. The "0" state of the L2 latch is not changed. When the "B clock" drops, the current path returns to device 11R, device 18R, 23R, 10R, 16L and 15R to the current source 25. It will be seen that the power to maintain L1 and L2 of the Shift Register Latch pair in a switched state is substantially half that required of prior art arrangements. Further, in a VLSI type circuit implementation, the arrangement permits an even further density of the circuits since a relatively large number of current sources may be omitted without sacrificing the LSSD testing technique advantages.

While the invention has been particularly shown and described with reference to a preferred embodiment thereof, it will be understood by those skilled in the art that various changes in the form and details may be made therein without departing from the spirit and scope of the invention.

Having thus described our invention, what we claim as new and desire to secure by Letters Patent is:

1. A Level Sensitive Scan Design (LSSD) Shift Register Latch (SRL) pair comprising in combination:
   an L1 bistable latch having an input, cross-coupled conductive devices and output nodes;
   an L2 bistable latch having an input, cross-coupled conductive devices and output nodes;
   a first clock signal;
   first current switch logic means responsive to said first clock signal to interconnect the output nodes of said L1 latch alternately to the input and the output nodes of said L2 latch for selectively transferring data in said L1 latch to said L2 latch;
   one current source; and
   second current switch logic means for connecting said one current source to the input of said L1 latch, so as to establish a current through a device of each latch to maintain each in a latched condition.

2. The combination recited in claim 1 in which each said bistable latch comprises a pair of cross-coupled bipolar transistors.

3. The combination recited in claim 2 in which said first current switch means comprises a pair of current switch cells each of which comprises a pair of emitter coupled bipolar transistor switches each of which is adapted to be operated in response to said first clock signal.

4. The combination recited in claim 3 in which said first current switch means further includes ballast resistors connecting each output node of said L1 latch respectively to said each of said pair of cells.

5. The combination recited in claim 4 in which said first clock signal is the complementary "B clock" signals of an associated Level Sensitive Scan Design testing system.

6. The combination recited in claim 5 in which one said bipolar transistor in each said switch cell is adapted to receive one phase of said "B clock" signal and the other said bipolar transistor in said switch cell is adapted to receive the complement of said "B clock" signal.

7. The combination recited in claim 6 in which each of said cross-coupled bipolar transistor of said L2 latch has a collector output terminal connected to one voltage source through different load resistors to permit a current path to be established from said current source through said second current switch logic means said L1 latch, said first current switch logic means, said L2 latch, and one of said load resistors to said one voltage source so that both said L1 and L2 latches remain latched when data is not being entered into either of said devices.

8. The combination recited in claim 7 in which said second current switch logic means includes four switch cells each of which comprises a pair of bipolar transistors having their emitters interconnected to define an input terminal for said cell.

9. The combination recited in claim 8 in which the first of said four switch cells has its input terminal connected to said current source and is adapted to receive the complementary "A clock" signals from said associated LSSD testing system.

10. The combination recited in claim 9 in which the collector of one of said transistors of said first four cells is coupled to the output nodes of said L1 latch through a second of said four cells which is adapted to receive the complemential "scan in" data from said associated LSSD testing system.

11. The combination recited in claim 10 in which the collector of said remaining transistor of each said first four cells is coupled to the input of a third of said four cells which is adapted to receive complementary "C clock" signals of said associated data processing system.

12. The combination recited in claim 11 in which the collector of one of said transistors of said third of said four cells is connected to the input of a fourth of said four cells and the collector of the other of said transistor of said third of said four cells is connected to the emitters of said bipolar transistors of said L1 device.

13. The combination recited in claim 12 in which said fourth of said four cells is adapted to be supplied with data to be stored in said L1 latch and the collectors of said transistors of said fourth of said four cells are connected to different output terminals of said L1 latch.

14. The combination recited in claim 13 implemented on a VLSI chip.

* * * * *